(12) United States Patent
Ren et al.

(10) Patent No.: US 10,504,811 B2
(45) Date of Patent: Dec. 10, 2019

(54) SELF-HEALING SEMICONDUCTOR TRANSISTORS

(71) Applicant: University of Florida Research Foundation, Incorporated, Gainesville, FL (US)

(72) Inventors: Fan Ren, Gainesville, FL (US); Stephen J. Pearton, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 15/551,490

(22) PCT Filed: Mar. 25, 2016

(86) PCT No.: PCT/US2016/024197
§ 371 (c)(1),
(2) Date: Aug. 16, 2017

(87) PCT Pub. No.: WO2016/160564
PCT Pub. Date: Oct. 6, 2016

(65) Prior Publication Data
US 2018/0240727 A1    Aug. 23, 2018

Related U.S. Application Data

(60) Provisional application No. 62/139,191, filed on Mar. 27, 2015.

(51) Int. Cl.
*H01L 31/0256* (2006.01)
*H01L 23/34* (2006.01)
(Continued)

(52) U.S. Cl.
CPC ........ *H01L 23/345* (2013.01); *H01L 29/2003* (2013.01); *H01L 29/205* (2013.01); *H01L 29/7787* (2013.01); *H01L 29/7786* (2013.01)

(58) Field of Classification Search
CPC ... H01L 22/14; H01L 23/345; H01L 23/5228; H01L 29/2003; H01L 2924/00014;
(Continued)

(56) References Cited

U.S. PATENT DOCUMENTS

| 7,723,824 B2 | 5/2010 | Guarin et al. |
| 8,138,573 B2 | 3/2012 | Cannon et al. |

(Continued)

OTHER PUBLICATIONS

Peng et al., "Post-process thermal treatment for microwave power improvement of AlGaN/GaN HEMTs," Microelectronic Engineering, Dec. 2010, pp. 2638-2641, vol. 87.
(Continued)

*Primary Examiner* — Robert G Bachner
(74) *Attorney, Agent, or Firm* — Alston & Bird LLP

(57) ABSTRACT

Materials and methods for improving the DC and RF performance of off-state step-stressed high electron mobility transistors (HEMTs) and devices are provided. A semiconductor device can include at least one HEMT and an on-chip heating source. A method of recovering the DC and RF performance of a stressed semiconductor device can include annealing the device with a built-in heating source of the device.

14 Claims, 12 Drawing Sheets

(51) Int. Cl.
    *H01L 29/20* (2006.01)
    *H01L 29/205* (2006.01)
    *H01L 29/778* (2006.01)

(58) Field of Classification Search
CPC ............. H01L 2924/00; H01L 29/7787; H01L 29/66462; H01L 21/0254; H01L 29/205; H01L 29/7786; H01L 21/0262; H01L 2224/05644; H01L 2224/48091; H01L 33/007; H03F 2200/451; H03F 2200/387; H03F 3/195; H03F 1/565; H03F 2200/222; H03F 3/193; H03F 3/213; H03F 1/0288; H03F 1/56; H03F 2200/225; H03F 2200/391; H03H 7/38; H03H 7/40; H03H 11/30; H03H 2007/013; C30B 29/406; C30B 25/183; C30B 29/403; C30B 25/02; C30B 25/18; C30B 29/02; C30B 29/06; C30B 29/68; C30B 33/04; G01K 7/01; G01K 15/005; G01K 1/14; G01K 1/16; G01K 2217/00; G01K 3/005; G01K 7/16; G01K 7/42
See application file for complete search history.

(56) References Cited

U.S. PATENT DOCUMENTS

| | | | |
|---|---|---|---|
| 2002/0033519 A1 | 3/2002 | Babcock et al. | |
| 2009/0179689 A1* | 7/2009 | Bolam | H01L 22/14 327/513 |
| 2009/0295457 A1* | 12/2009 | Mowry | H01L 23/34 327/512 |
| 2010/0084627 A1* | 4/2010 | Berger | H01L 47/00 257/7 |
| 2010/0258843 A1 | 10/2010 | Lidow et al. | |

OTHER PUBLICATIONS

Lee et al., "Post-annealing effects on device performance of AlGaN/GaN HFETs," Solid-State Electronics, Oct. 2004, pp. 1855-1859, vol. 48.

Liu et al., "Characteristics of gate leakage current and breakdown voltage of AlGaN/GaN high electron mobility transistors after postprocess annealing," Journal of Vacuum Science and Technology B, Sep./Oct. 2014, pp. 052201-1-052201-5, vol. 32, No. 5.

Makaram et al., "Evolution of structural defects associated with electrical degradation in AlGaN/GaN high electron mobility transistors," Applied Physics Letters, Jun. 2010, pp. 233509-1-233509-3, vol. 96.

Mitrofanov et al., "Poole-Frenkel electron emission from the traps in AlGaN/GaN transistors," Journal of Applied Physics, Jun. 2004, pp. 6414-6419, vol. 95, No. 11.

Singh et al., "Design of high electron mobility devices with composite nitride channels," Journal of Applied Physics, Aug. 2003, pp. 2498-2506, vol. 94, No. 4.

Khan et al., "AlGaN/GaN metal-oxide-semiconductor heterostructure field-effect transistors on SiC substrates," Applied Physics Letters, Aug. 2000, pp. 1339-1341, vol. 77, No. 9.

Johnson et al., "Effect of gate length on DC performance of AlGaN/GaN HEMTs grown by MBE," Solid-State Electronics, Dec. 2001, pp. 1979-1985, vol. 45.

Kim et al., "Hot electron induced degradation of undoped AlGaN/GaN HFETs," Microelectronics Reliability, Jun. 2003, pp. 823-827, vol. 43.

Mitrofanov et al., "Impact of Si doping on radio frequency dispersion in unpassivated GaN/AlGaN/GaN high-electron-mobility transistors grown by plasma-assisted molecular-beam epitaxy," Applied Physics Letters, Jun. 2003, pp. 4361-4363, vol. 82, No. 24.

Green et al., "The effect of surface passivation on the microwave characteristics of undoped AlGaN/GaN HEMT's," IEEE Electron Device Letters, Jun. 2000, pp. 268-270, vol. 21, No. 6.

Ohno et al., "Effects of surface passivation on breakdown of AlGaN/GaN high-electron-mobility transistors," Applied Physics Letters, Mar. 2004, pp. 2184-2186, vol. 84, No. 12.

Hashizume et al., "Surface passivation of GaN and GaN/AlGaN heterostructures by dielectric films and its application to insulated-gate heterostructure transistors," Journal of Vacuum Science and Technology B, Aug. 2003, pp. 1828-1838, vol. 21, No. 4.

Chang et al., "Reverse gate bias-induced degradation of AlGaN/GaN high electron mobility transistors," Journal of Vacuum Science and Technology B, Sep. 2010, pp. 1044-1047, vol. 28, No. 5.

Faqir et al., "Characterization and analysis of trap-related effects in AlGaN-GaN HEMTs," Microelectronics Reliability, Sep. 2007, pp. 1639-1642, vol. 47.

Pengelly et al., "A review of GaN on SiC high electron-mobility power transistors and MMICs," IEEE Transactions on Microwave Theory and Techniques, Jun. 2012, pp. 1764-1783, vol. 60, No. 6.

Fang et al., "Deep traps in AlGaN/GaN heterostructures studied by deep level transient spectroscopy: effect of carbon concentration in GaN buffer layers," Journal of Applied Physics, Sep. 2010, pp. 063706-1-063706-6, vol. 108.

International Search Report and Written Opinion, International Application No. PCT/US2016/024197, PCT/ISA/210, PCT/ISA/237, dated Jun. 30, 2016.

Lalinsky et al., "AlGaN/GaN based SAW-HEMT structures for chemical gas sensors", Procedia Engineering, vol. 5, 2010, pp. 152-155.

Douglas et al., "AlGaN/GaN High Electron Mobility Transistor degradation under on- and off-state stress", Microelectronics Reliability, vol. 51, Issue 2, 2010, pp. 207-211.

Wang et al., "Enhancement-mode InAlN/AlN/GaN HEMTs with 10-12 A/mm leakage current and 1012 on/off current ratio," IEEE Electron Device Letters, Mar. 2011, pp. 309-311, vol. 32, No. 3.

Kim et al., "Gate current leakage and breakdown mechanism in unpassivated AlGaN/GaN high electron mobility transistors by post-gate annealing," Applied Physics Letters, Mar. 2005, pp. 143505-1-143505-3, vol. 86.

Johnson et al., "Transmission electron microscopy characterization of electrically stressed AlGaN/GaN high electron mobility transistor devices," Journal of Vacuum Science and Technology B, Nov./Dec. 2012, pp. 062204-1-062204-7, vol. 30, No. 6.

Cheney et al., "Reliability studies of AlGaN/GaN high electron mobility transistors," Semiconductor Science and Technology, Jun. 2013, pp. 1-12, vol. 28.

Meneghesso et al., "Reliability of GaN high-electron-mobility transistors: state of the art and perspectives," IEEE Transactions on Device and Materials Reliability, Jun. 2008, pp. 332-343, vol. 8, No. 2.

Zanoni et al., "A review of failure modes and mechanisms of GaN-based HEMTs," IEEE International Electron Devices Meeting, Dec. 2007, pp. 381-384.

Chung et al., "Effect of gate leakage in the subthreshold characteristics of AlGaN/GaN HEMTs," IEEE Electron Device Letters, Nov. 2008, pp. 1196-1198, vol. 29, No. 11.

Chung et al., "Estimation of trap density in AlGaN/GaN HEMTs from subthreshold slope study," Proceedings of the 65th Annual Device Research Conference, Jun. 2007, pp. 111-112.

Tan et al., "Gate leakage effects and breakdown voltage in metalorganic vapor phase epitaxy AlGaN/GaN heterostructure field-effect transistors," Applied Physics Letters, Apr. 2002, pp. 3207-3209, vol. 80, No. 17.

Sun et al., "100 nm gate AlGaN/GaN HEMTs on silicon with fT=90 GHz," Electronics Letters, Mar. 2009, pp. 1-2, vol. 45, No. 7.

Hasegawa et al., "Current collapse transient behavior and its mechanism in submicron-gate AlGaN/GaN heterostructure transistors," Journal of Vacuum Science and Technology B, Jul. 2009, pp. 2048-2054, vol. 27, No. 4.

Karmalkar et al., "On the resolution of the mechanism for reverse gate leakage in AlGaN/GaN HEMTs," IEEE Electron Device Letters, Feb. 2006, pp. 87-89, vol. 27, No. 2.

(56) References Cited

OTHER PUBLICATIONS

Zhang et al., "Effects of surface traps on breakdown voltage and switching speed of GaN power switching HEMTs," International Electron Devices Meeting, Technical Digest, Dec. 2001, pp. 589-592.

Gassoumi et al., "Analysis of deep levels in AlGaN/GaN/Al2O3 heterostructures by CDLTS under a gate pulse," Physica B, May 2010, pp. 2337-2339, vol. 405.

Gassoumi et al., "The effects of gate length variation and trapping effects on the transient response of AlGaN/GaN Hemt's on SiC substrates," Microelectronic Engineering, Apr. 2011, pp. 370-372, vol. 88.

Zhang et al., "Correlation of device performance and defects in AlGaN/GaN high-electron mobility transistors," Journal of Electronic Materials, May 2003, pp. 388-394, vol. 32, No. 5.

Liu et al., "Novel oxide-passivated AlGaN/GaN HEMT by using hydrogen peroxide treatment," IEEE Transactions on Electron Devices, Dec. 2011, pp. 4430-4433, vol. 58, No. 12.

Hierro et al., "Hydrogen passivation of deep levels in n-GaN," Applied Physics Letters, Sep. 2000, pp. 1499-1501, vol. 77, No. 10.

Liu et al., "Effect of source field plate on the characteristics of off-state, step-stressed AlGaN/GaN high electron mobility transistors," Journal of Vacuum Science and Technology B, May/Jun. 2011, pp. 032204-1-032204-5, vol. 29, No. 3.

Raab, "Electronically tuned UHF power amplifier," IEEE International Microwave Symposium Digest, Jun. 2011, pp. 1-4.

Wang et al., "Kink effect in AlGaN/GaN HEMTs induced by drain and gate pumping," IEEE Electron Device Letters, Apr. 2011, pp. 482-484, vol. 32, No. 4.

Kim et al., "Recovery in dc and rf performance of off-state step-stressed AlGaN/GaN high electron mobility transistors with thermal annealing," Applied Physics Letters, Apr. 2015, pp. 153504-1-153504-4, vol. 106.

Liu et al., "Investigating the effect of off-state stress on trap densities in AlGaN/GaN high electron mobility transistors," Journal of Vacuum Science and Technology B, Nov./Dec. 2011, pp. 060603-1-060603-5, vol. 29, No. 3.

\* cited by examiner

SELF-HEALING SEMICONDUCTOR TRANSISTORS

CROSS-REFERENCE TO RELATED APPLICATIONS

The present application is a national stage application of International Application No. PCT/US2016/024197 filed Mar. 25, 2016 which claims the benefit of U.S. Provisional Application Ser. No. 62/139,191, filed Mar. 27, 2015, both of which are incorporated herein by reference in their entirety, including any figures, tables, and drawings.

GOVERNMENT SUPPORT

This invention was made with government support under grant No. 1-11-1-0020 awarded by U.S. DOD HDTRA and grant No. ECCS-1445720 awarded by National Science Foundation. The government has certain rights in the invention.

BACKGROUND OF INVENTION

High electron mobility transistors (HEMTs) are excellent candidates for high power and high frequency applications. However, some undesired issues, such as electron trapping at surface states of HEMTs, affect the breakdown voltage, gate leakage current and current collapse, and could lead to degraded direct current (DC) and radio frequency (RF) performance. These issues hinder the advancement of GaN-based power and high frequency device technology. Degraded HEMTs show a significantly higher trap density, which can be confirmed by temperature-dependent drain-current sub-threshold swing measurements. Step-stress induced gate metal diffusions and notches formed along the gate edges on drain side or on both source and drain sides have been reported to be the causes of permanent device degradation in HEMTs.

BRIEF SUMMARY

The subject invention provides materials and methods for improving the DC and RF performance of transistors and devices, including high electron mobility transistors (HEMTs) and in particular off-state step-stressed HEMTs and devices.

In an embodiment, a semiconductor device can include: at least one HEMT provided on a substrate; and a heating source provided on the substrate.

In another embodiment, a method of thermally recovering DC and RF performance of a semiconductor device comprising at least one HEMT that, under normal conditions for a period of time, shows degradation in the form of at least one of gate leakage current increase and drain current reduction can include thermally annealing the HEMT using a built-in heating source of the device.

DETAILED DISCLOSURE

Figures 1A, 1B, 1C:
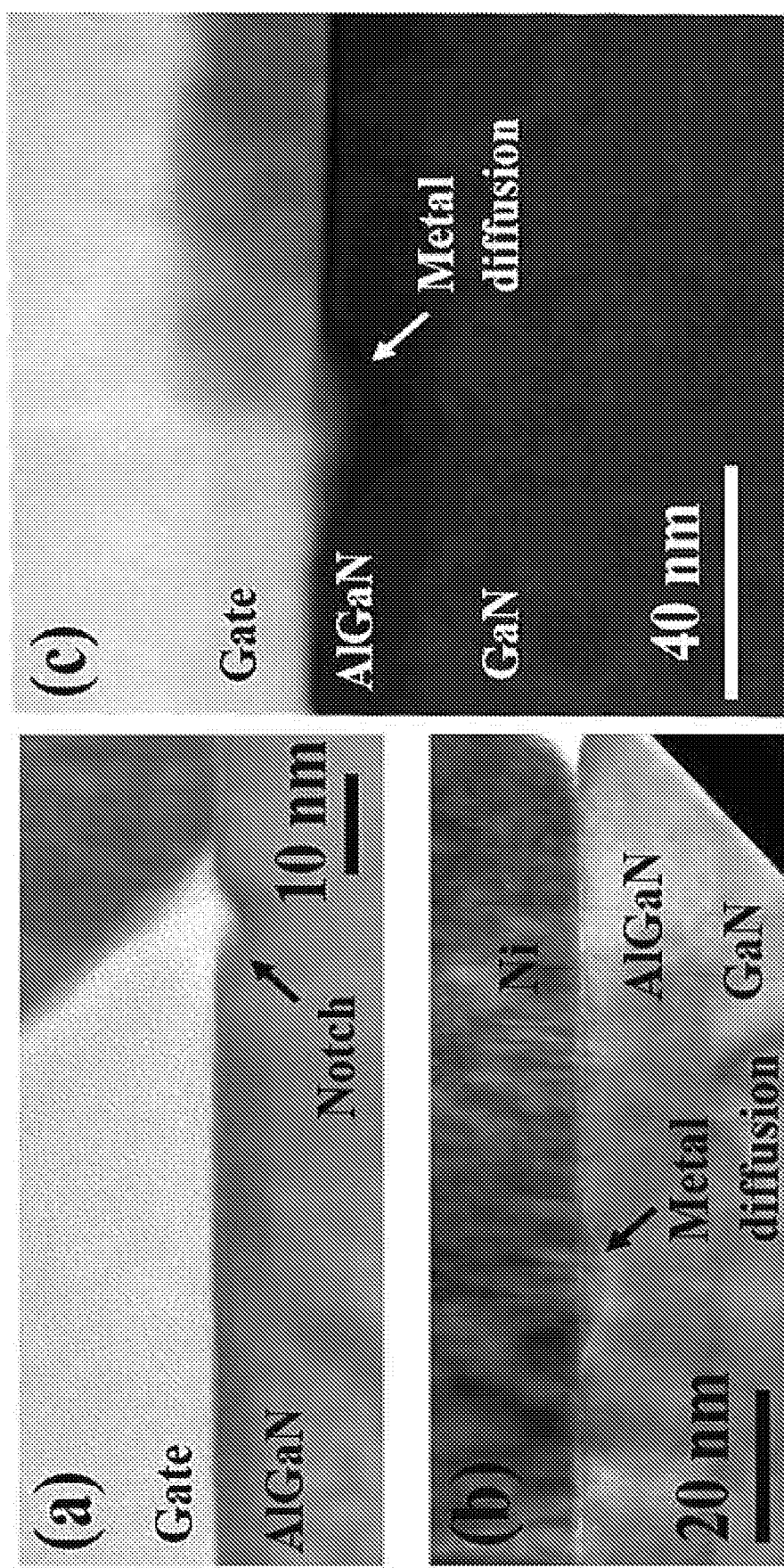
FIG. 1a shows a cross-sectional TEM image of a gate metal/semiconductor interface.
FIG. 1b shows a cross-sectional TEM image of a gate metal/semiconductor interface.
FIG. 1c shows a cross-sectional TEM image of a gate metal/semiconductor interface after thermal annealing.

In the following detailed description, reference is made to the accompanying drawings, depicting exemplary, non-limiting and non-exhaustive embodiments of the invention. These embodiments are described in sufficient detail to enable those having skill in the art to practice the invention, and it is understood that other embodiments may be used, and other changes may be made, without departing from the spirit or scope of the invention. The following detailed description is, therefore, not to be taken in a limiting sense, and the scope of the invention is defined only by the appended claims. All patents, patent applications, provisional applications, and publications referred to or cited herein are incorporated by reference in their entirety, including all figures and tables, to the extent they are not inconsistent with the explicit teachings of this specification.

The subject invention provides materials and methods for improving the DC and RF performance of transistors and devices, including high electron mobility transistors (HEMTs) and in particular off-state step-stressed HEMTs and devices.

In one aspect, the subject invention provides a device (e.g., a semiconductor device) comprising at least one transistor and a heating source. The transistor can be an HEMT. Advantageously, the heating source can be integrated on-chip to provide global heating to the multiple HEMTs without needing to be positioned immediately next to the transistors, simplifying the number of heating elements needed on a given chip. This heating mechanism can be different from a case where each transistor on the circuit is integrated with a heating source in order to remove the effect of trapped charge at the interface between Si and the gate dielectric material (e.g., an oxide) in each transistor. This heating mechanism can also be different from a case where a heating source is integrated within a device's substrate.

In some embodiments, the Schottky barrier and the cap layer of the HEMT can include distinct III-V semiconductor compounds with dissimilar bandgaps. In an embodiment, the HEMT can be an enhancement-mode GaN-based HEMT or a depletion-mode GaN-based HEMT, and the HEMT can include distinct semiconductor compounds with dissimilar bandgaps. A particular embodiment provides that the barrier material is $Al_xGa_{1-x}N$ and the cap layer material is GaN. Examples of Group III elements that may be incorporated in the composition of an HEMT include, but are not limited to, Al, Ga, and In. Examples of Group V elements that may be incorporated in the composition of an HEMT include, but are not limited to, N, P, and As. Further embodiments provide that the HEMT does not include silicon-based semiconductor as a barrier material, or oxides and/or oxynitrides as gate dielectric materials. It is worth noting that the compositions of the HEMT barrier/cap layer in the present invention can differ from those in the related art that use Si as the semiconductor material and oxides and/or oxynitrides as gate dielectric materials.

In various embodiments, the heating source can be coupled to an HEMT by being adjacent to the HEMT, on the HEMT, below the HEMT, or provided on the same chip or substrate on which the HEMT is provided. The heating source can be in direct physical contact with the HEMT or can be physically separated from the HEMT such that they are not in direct physical contact with each other. In certain embodiments, a global heating source can be provided on-chip or on a substrate and can be used for annealing of one or more HEMTs that are provided on the same chip or substrate on which the global heating source is provided. The heating source can be capable of annealing one or more HEMTs at a high temperature, for example over 400° C. The temperature at which the heating source can be capable of annealing can be, for example, any of the following values, about any of the following values, at least any of the following values, or any range having any of the following values as endpoints (all numerical values are in ° C.): 100, 150, 200, 250, 300, 350, 400, 410, 420, 430, 440, 445, 450, 455, 460, 470, 480, 490, 500, 550, 600, 650, 700, 750, 800, 850, 900, or 950. The heating source can be capable of annealing for any suitable amount of time consecutively, for example, for 1 second, 2 seconds, 3 seconds, 4 seconds, 5 seconds, 6 seconds, 7 seconds, 8 seconds, 9 seconds, 10 seconds, 15 seconds, 20 seconds, 25 seconds, 30 seconds, 35 seconds, 40 seconds, 45 seconds, 50 seconds, 55 seconds, 1 minute, 2 minutes, 3 minutes, 4 minutes, 5 minutes, 6 minutes, 7 minutes, 8 minutes, 9 minutes, 10 minutes, 15 minutes, 20 minutes, 25 minutes, 30 minutes, or more, or any range within these time frames. For example, the annealing can be at 450° C. for 10 minutes, at 850° C. for 10-45 seconds, or at a temperature in a range of 400-900° C. for 1 second to 20 minutes. The heating can take place in any suitable ambient environment (e.g., ambient air, nitrogen gas, argon gas, etc.).

The heating source, in some embodiments, can be in a trapezoid configuration in order to achieve uniform temperature distributions across the active region of the device by reducing resistance in the middle section of the heating source. In a particular embodiment, the heating source comprises platinum.

In many embodiments, an HEMT can include a wider energy bandgap nitride-based layer. The wider energy bandgap nitride-based layer can include at least one of AlGaN, AlN, and InAlN, though embodiments are not limited thereto.

In a particular embodiment, an HEMT device structure can be grown on a semi-insulating substrate that can include SiC (e.g., a 6H—SiC substrate). The HEMT device can include a thin nucleation layer (e.g., an AlN nucleation layer), a buffer layer (e.g., a GaN buffer layer, such as 2.25 µm of Fe-doped GaN buffer layer), an $Al_xGa_{1-x}N$ barrier, (e.g., an $Al_{0.28}Ga_{0.72}N$ barrier, such as 15 nm of $Al_{0.28}Ga_{0.72}N$ barrier), and a cap layer (e.g., a GaN cap layer, such as a 3 nm undoped GaN cap layer). Device isolation can be provided; for example, device isolation can be achieved with $Cl_2$ plasma-based dry etching, though embodiments are not limited thereto. Ohmic contacts can be provided; for example, Ti/Al/Ni/Au Ohmic contacts can be alloyed at, e.g., 850° C., producing a contact resistance of, e.g., 0.3 Ω·mm. Gate-fingers can be included; for example, Ni/Au based dual gate-fingers can be defined by a standard lift-off process. The gate length and gate width can be any suitable values; for example, the gate length can be on the order of 1 µm, and the gate width can be on the order of 100 µm (e.g., 2×150 µm).

In many embodiments, a method of recovering DC and RF performance of a stressed device can include annealing a device with a heat source. The device can be a semiconductor device, such as a transistor (e.g., an HEMT). The stress can be due to drain-voltage step-stressing (e.g., off-state drain-voltage step-stressing) of a transistor (e.g., an HEMT). The annealing can be performed with a built-in heating source, such as a heating source as described herein (e.g., a global heating source). In some embodiments, the device undergoes drain-voltage step-stress prior to annealing, resulting in the creation of trapped charges within the cap layer when the operating voltage exceeds a threshold value. Device degradation can occur when increases of sub-threshold swing and sub-threshold current, and reduction of saturation drain current and drain current on-off ratio, are observed. Advantageously, performing the annealing process can correct some or all of such degradation.

In an embodiment, the annealing temperature is 450° C. or about 450° C., and the annealing is carried out for 10 minutes or about 10 minutes. The annealing can be performed in any environment (e.g., ambient air or nitrogen ambient). In certain embodiments, the annealing process can be performed more than once (e.g., 2 times, 3 times, 4 times, etc.). The stress-anneal cycle can be repeated, and the same recovery effects can be observed.

The positive effects due to thermal annealing according to embodiments of the subject invention (e.g., effects on the DC and RF performance of HEMTs after off-state drain-voltage step-stress) can be demonstrated by one or more of the forward and reverse bias gate current, Schottky barrier height, ideality factor, sub-threshold drain current characteristics, and small signal RF measurements. Transmission electron microscopy (TEM) imaging can also be used to examine degradation that occurs at a metal-AlGaN interface of an HEMT due to off-state drain-voltage step-stress.

According to embodiments of the subject invention, traps created during step-stressing can be annealed out with the thermal annealing process. Such traps can be shallow traps, though embodiments are not limited thereto. Advantageously, global heating provided by an integrated heat source on-chip can increase device lifetime significantly, which is particularly advantageous for remote electronics including but not limited to, satellites, nuclear reactors, and engines.

According to embodiments of the subject invention, degradation (such as drain current reduction, increases of parasitic resistance and gate leakage current, and decreases of $f_T$ and $f_{MAX}$) of a device (e.g., an HEMT) can be completely recuperated after an annealing process as described herein (e.g., an annealing process at 450° C. for 10 minutes). Though off-state step-stressed HEMTs show a significantly higher trap density as compared to that of the pre-stressed HEMTs, these additional traps generated from step-stress can be mostly, or even completely, removed with the thermal annealing process (e.g., at 450° C. for 10 minutes). Understanding and control of trap-related effects is important to improve the performance of high power GaN HEMT devices. The experimental results presented below show that thermal annealing as described herein can recover much of the degradation caused by step-stressing of an HEMT below the threshold, thereby avoiding permanent damage.

A greater understanding of the present invention and of its many advantages may be had from the following examples, given by way of illustration. The following examples are illustrative of some of the methods, applications, embodiments and variants of the present invention. They are, of course, not to be considered as limiting the invention. Numerous changes and modifications can be made with respect to the invention.

EXAMPLE 1

The effects of thermal annealing on the DC and RF performance of off-state, drain-voltage step-stressed HEMTs was tested by evaluating sub-threshold drain current, gate I-V characteristics, and small signal RF measurements. All of these parameters were measured prior to off-state, drain-voltage step-stressing, after step-stressing, and following a subsequent thermal annealing at 450° C. for 10 minutes in nitrogen ambient (subsequent to the off-state drain-voltage step-stressing). Temperature-dependent drain current sub-threshold swing measurements were employed to evaluate HEMT trap densities. Transmission electron microscopy (TEM) imaging was used to examine the degradation occurring at the metal-AlGaN interface.

HEMT device structures were grown on semi-insulating 6H—SiC substrates and included a thin AlN nucleation layer, 2.25 μm of Fe-doped GaN buffer, 15 nm of $Al_{0.28}Ga_{0.72}N$, and a 3 nm undoped GaN cap. Device isolation was achieved with $Cl_2$ plasma-based dry etching. Ti/Al/Ni/Au Ohmic contacts were alloyed at 850° C., producing a contact resistance of 0.3 Ω·mm. Ni/Au-based dual gate-fingers were defined by standard lift-off process. The gate length was 1 μm, and gate width was 2×150 μm.

Off-state drain-voltage step-stressing was employed to degrade the DC and RF performance of the HEMTs. The stress started at 5 V of drain voltage, and the increment of the drain voltage step was kept at 1 V. Each drain voltage step was held constant for 60 seconds, while grounding the source electrode and fixing the gate voltage at −8 V. During the step-stressing, total gate leakage current, gate-to-source leakage current and gate-to-drain leakage current were monitored. Between each step stress, the drain I-V characteristics, extrinsic transconductance, gate forward current when biased from 0 to 2 V, and gate reverse current when biased from 0 to −10 V were recorded. The step-stresses were stopped when a critical voltage was reached and the critical voltage was defined as the onset of a sudden total gate leakage current increase during the stress. The critical voltages of HEMTs employed were around 30-50V. Due to the low drain-to-source current during off-state stressing, self-heating effects were negligible and had no effect on device performance.

Thermal annealing was conducted for the post-stress HEMTs at 450° C. for 10 minutes in nitrogen ambient using a Steag 100CS rapid thermal annealing system. A Wentworth automated temperature control chuck was used to perform temperature dependent DC measurements, and chuck temperature was varied from room temperature to 400 K. The device DC characteristics were measured with a HP 4156 parameter analyzer. Cross sections of some devices were prepared for TEM examination using a Nova 200 focused-ion-beam system.

FIGS. 1a-1c show cross-sectional TEM images of a gate metal/semiconductor interface after stress. FIG. 1a shows a cross-sectional TEM image of the edge of the gate close to the source contact, FIG. 1b shows a cross-sectional TEM image of the edge of the gate close to the drain contact, and FIG. 1c shows a cross-sectional TEM image of the gate after thermal annealing at 450° C. without being stressed. The reference bar in FIG. 1a is 10 nanometers (nm), the reference bar in FIG. 1b is 20 nm, and the reference bar in FIG. 1c is 40 nm.

Referring to FIG. 1a, a notch was observed on both sides of the gate finger for the stressed sample. These defective regions could be the initial stages of cracking due to the inverse piezoelectric effect. Several regions exhibited interactions between Ni with the underlying nitride layer close to the position of an associated threading dislocation (TD), as shown in FIG. 1b. The thermally annealed HEMTs also displayed similar defects related to metal diffusion at the gate metal/semiconductor interface, as shown in FIG. 1c. Both thermal annealing and off-state step-stressed HEMTs could produce gate metal interactions with the underlying AlGaN.

Figure 2:
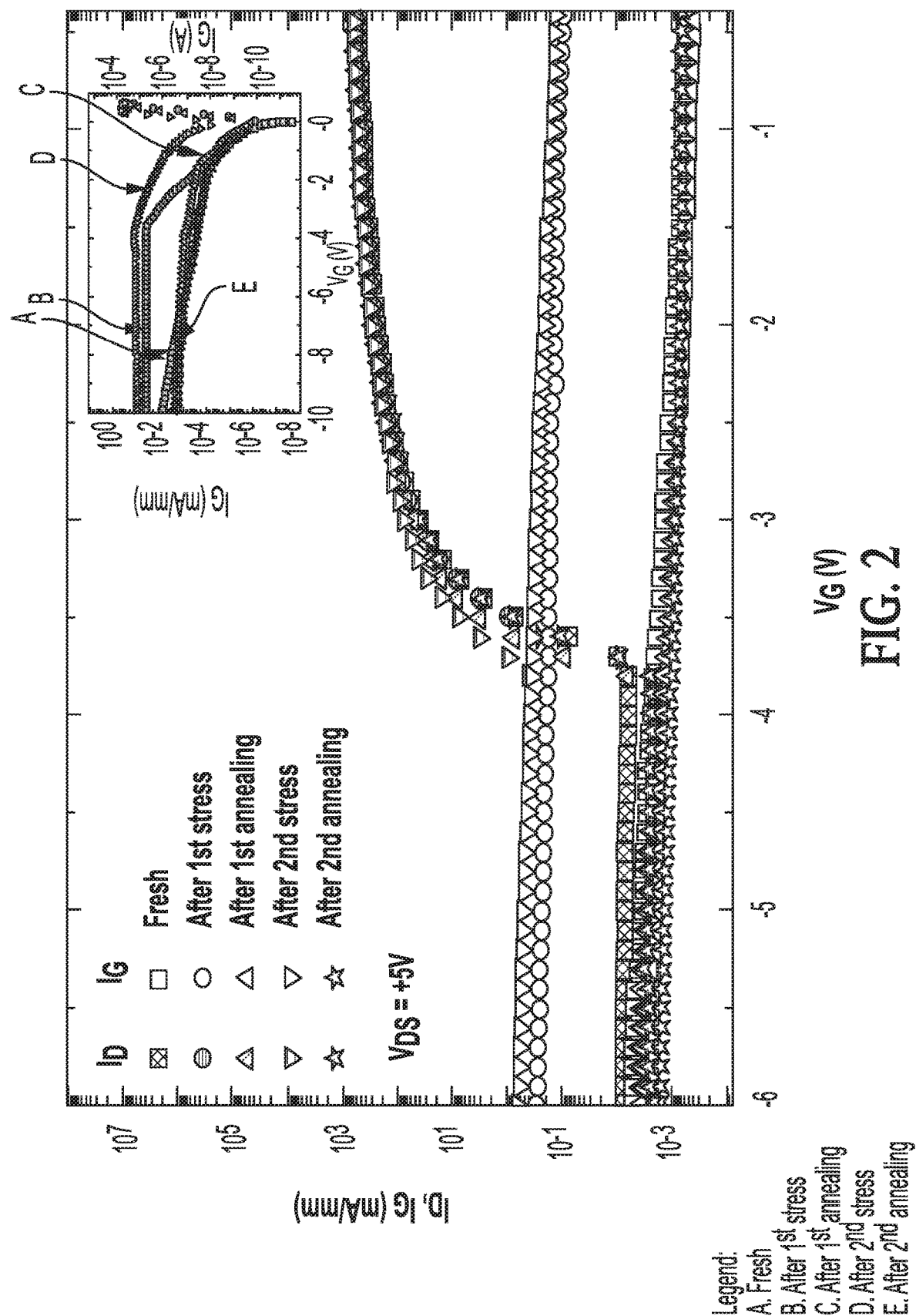
FIG. 2 shows a plot of drain current and gate leakage current as a function of gate voltage.

FIG. 2 shows a plot of drain current and gate leakage current as a function of gate voltage. The currents are shown for AlGaN/GaN HEMTs prior to off-state drain-voltage step-stressing, after first off-state drain-voltage step-stressing, after first thermal annealing, after second step-stressing, and after second thermal annealing. The inset of FIG. 2 shows the forward and reverse gate I-V characteristics of the HEMTs. The first annealing was performed at 450° C. for 10 minutes in nitrogen ambient, the second thermal annealing was also performed at 450° C. After both off-state drain-voltage step-stressing, HEMT DC performance considerably degraded. In addition, significant increases of sub-threshold swing and sub-threshold leakage current occurred, as did reduction of saturation drain current and drain current on-off ratio. Unexpectedly and advantageously, these degradations of DC performance due to reaching a critical voltage after off-state step-stress were completely recovered after 450° C. annealing for HEMTs either stressed once or twice.

The drain leakage current is dominated by reverse-biased gate current in the sub-threshold region. Thus, both sub-threshold swing and sub-threshold drain leakage current corresponded to changes in reverse gate leakage current, as shown in FIG. 2 and the insert in FIG. 2. There was almost no difference in Schottky barrier height or ideality factor for all the samples used; however, the reverse-bias gate leakage current significantly increased after off-state step-stressing. Nevertheless, the degradation of the reverse-bias gate leakage also completely recovered after 450° C. annealing, as illustrated in the insert of FIG. 2. Both thermally annealed and off-state step-stressed HEMTs showed metal diffusion, and the thermal annealing process removed neither this metal diffusion nor the notch formation along the gate edges.

Because the thermal annealing recuperated the reverse bias gate leakage current, the observed degradation of HEMT DC performance after off-state drain-voltage step-stressing is related to neither gate metal diffusion nor notch formation on the AlGaN/GaN layer in the devices tested. These degradations could result from creating shallow traps during off-state step-stressing, and these traps were annealed out with the thermal annealing process.

Drain current sub-threshold swing can be used to quantify trap densities in the gate modulated region of metal oxide semiconductor field effect transistors and AlGaN/GaN HEMTs.

Figure 3:
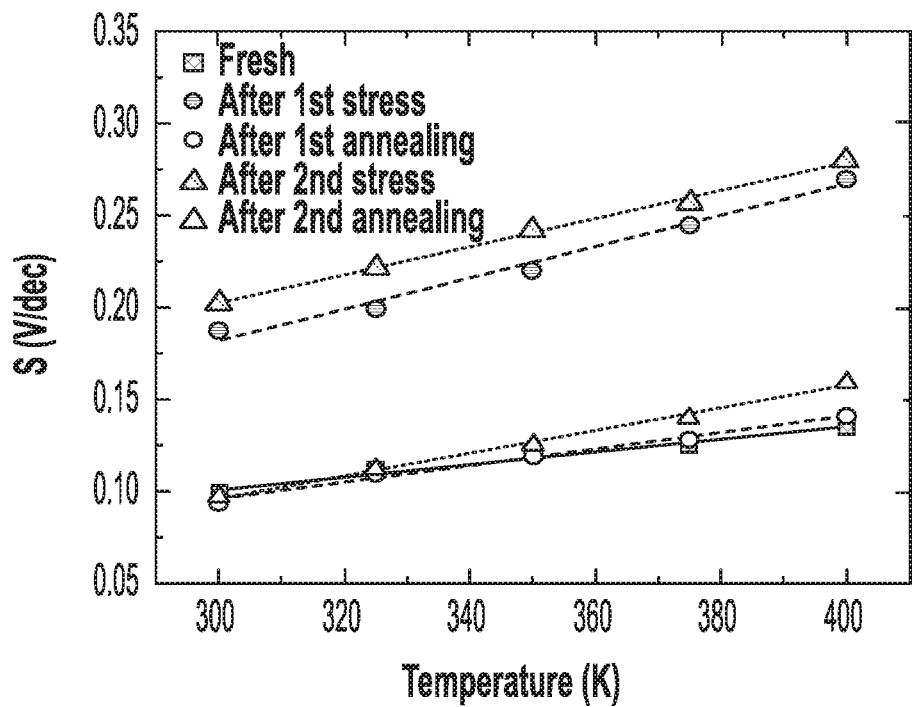
FIG. 3 shows a plot of sub-threshold swing as a function of temperature.

FIG. 3 shows a plot of sub-threshold swing (S) as a function of temperature for HEMTs prior to off-state drain-voltage step-stressing, after first off-state drain-voltage step-stressing, after first thermal annealing, after second step-stressing and after second thermal annealing. Referring to FIG. 3, the sub-threshold swing increased from −98 to −187 mV/dec after step-stressing and recovered to −95 mV/dec after thermal annealing. Sub-threshold swing and sub-threshold leakage current were correlated to reverse gate leakage current because the drain leakage current was dominated by the reverse-biased gate current in the pinched-off region. This temperature-dependent behavior of gate leakage current in AlGaN/GaN heterostructures can be attributed to surface hopping as the emission of electrons from a trapped state near the metal-semiconductor interface into a continuum of states associated with each conductive dislocation based on the Frenkel-Poole model (see also Mitrofanov et al., Appl. Phys., 2004, which is hereby incorporated by reference in its entirety). The interface trap density of HEMTs can be extracted from the change of S with temperature. By analogy with metal oxide semiconductor field effect transistors (MOSFETs), the equation for trap density of AlGaN/GaN HEMT is given by:

$$\frac{\partial S}{\partial T} = \frac{k}{q}\ln(10)(1+\varsigma) \quad (1)$$

$$\varsigma = \frac{C_{it}}{C_{AlGaN}} \quad (2)$$

$$D_{it} = \frac{C_{it}}{q} \quad (3)$$

where $D_{it}$ is interface trap density, $C_{it}$ is the interface trap capacitance, q is magnitude of electronic charge, $C_{AlCaN}$ is AlGaN layer capacitance, and k is Boltzmann's constant. $\varsigma$ can be evaluated from Equation (3) using the slope of the S vs. T curve. The estimated interface trap density from $D_{it}$ with Equation (1) were $3.28 \times 10^{12}$, $10^{13}$, $4.93 \times 1.27 \times 10^{12}$, $1.04 \times 10^{13}$, and $5.41 \times 10^{12}/cm^2$-V for HEMTs prior to off-state drain-voltage step-stressing, after first off-state drain-voltage step-stressing, after first subsequent thermal annealing (subsequent to first off-state drain-voltage step-stressing but prior to second step-stressing), after second step-stressing, and after second subsequent thermal annealing (subsequent to second off-state drain-voltage step-stressing), respectively. After off-state drain voltage step-stressing, the trap density increased around one order of magnitude and reduced to the same level as the reference (prior to any step-stressing) HEMT after thermal annealing. These additionally generated traps during the off-state step-stressing provided more gate leakage paths and degraded device performance.

Figure 4:
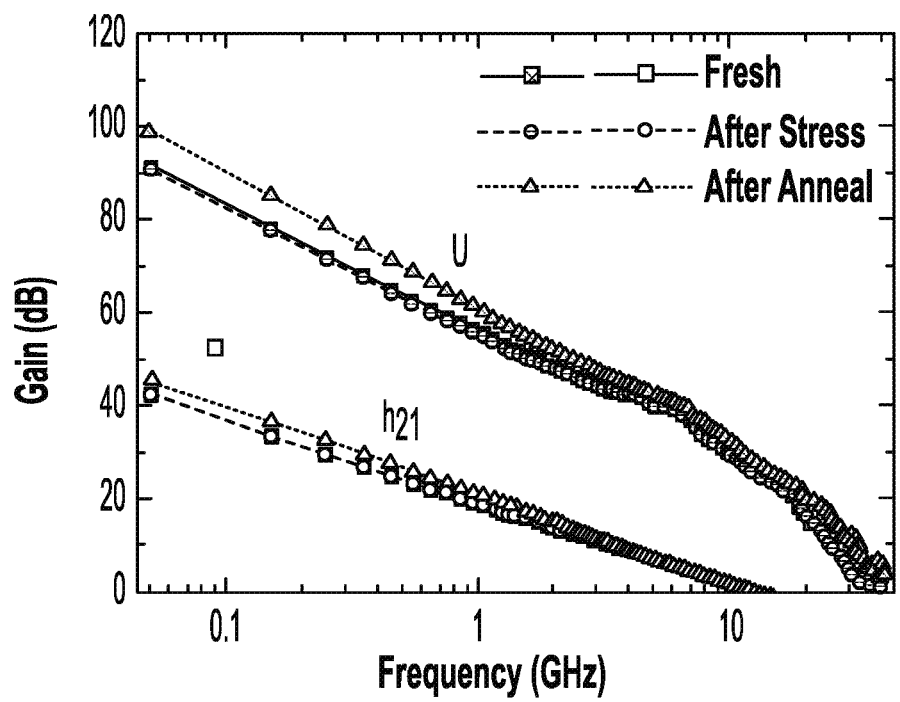
FIG. 4 shows a plot of gain as a function of frequency.

FIG. 4 shows a plot of current gain ($h_{21}$), and U gain as a function of frequency before step-stressing ("fresh"), after step-stressing, and after subsequent annealing. Referring to FIG. 4, the effect of step-stressing and thermal annealing on small signal RF characteristics measured at Vds of 8V and Vg biased around the peak of extrinsic transconductance can be seen. Unity-gain cut-off frequency, $f_T$, and maximum oscillation frequency, $f_{max}$, for the reference HEMTs were 10 and 58 GHz, respectively. After reaching the critical voltage, the $f_T$ and $f_{MAX}$ of the stressed device decreased to 9 and 49 GHz due to the increases of parasitic resistance and gate-to-drain capacitance estimated with s-parameter extraction based on the FET T-model. Similar trends were observed as for HEMT DC performance, with $f_T$ and $f_{MAX}$ completely mended after thermal annealing.

EXAMPLE 2

HEMT device structures were grown on semi-insulating 6H—SiC substrates and included a thin AlN nucleation layer, 2.25 µm of Fe-doped GaN buffer, 15 nm of $Al_{0.28}Ga_{0.72}N$, and a 3 nm undoped GaN cap. On-wafer Hall measurements showed sheet carrier concentrations of $1.06 \times 10^{13}$ cm$^{-2}$, mobility of 1907 cm$^2$/V-s, and sheet resistivity of 310Ω/□ (Ohms per square). The HEMTs employed dry etched mesa isolation, Ti/Al/Ni/Au Ohmic contacts alloyed at 850° C. (contact resistance of 0.3 Ω·mm), and dual-finger Ni/Au gates patterned by lift-off. The gate length was 1 µm, and gate width was 2×150 µm. Both source-to-gate gap and gate-to-drain distances were 2 µm. The devices exhibited typical maximum drain currents of 1.1 A/mm, extrinsic transconductance of 250 mS/mm at $V_{DS}$ of 10 V, threshold voltage of −3.6 V.

Off-state drain-voltage step-stressing was employed to degrade HEMTs DC performance. The stress started at 5 V of drain voltage, and the drain voltage step was kept at 1 V. Each drain voltage step was held constant for 60 seconds, while grounding the source electrode and fixing the gate voltage at −8V. During the step-stressing, total gate leakage current, gate-to-source leakage current, and gate-to-drain leakage current were monitored. Between each step stress, the drain I-V characteristics, extrinsic transconductance, gate forward current when biased from 0 to 2 V, and gate reverse current when biased from 0 to −10 V were recorded. The step-stresses were stopped when a critical voltage was reached, and the critical voltage was defined as the onset of a sudden total gate leakage current increase during the stress. The critical voltages of HEMTs employed were around 30-50V. Due to the low drain-to-source current during off-state stressing, self-heating effects were negligible and had no effect on device performance.

Thermal annealing was conducted for the post-stress HEMTs at 450° C. for 10 minutes in nitrogen ambient using a Steag 100CS rapid thermal annealing system. A Wentworth automated temperature control chuck was used to perform temperature dependent DC measurements, and chuck temperature was varied from room temperature to 400 K. The device DC characteristics were measured with a HP 4156 parameter analyzer.

Figure 5:
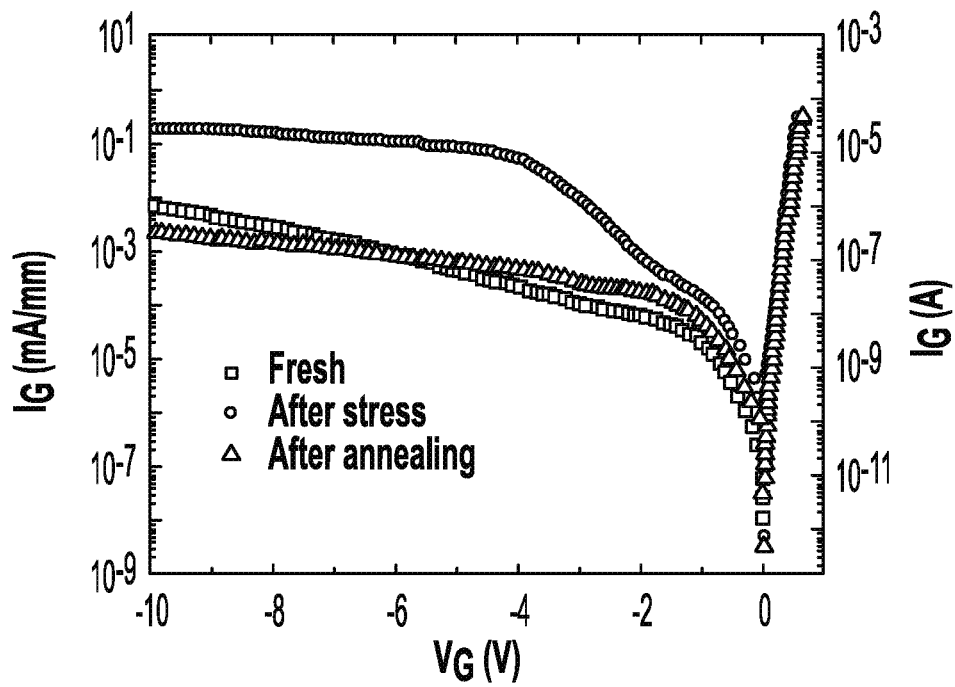
FIG. 5 shows a plot of forward and reverse I-V characteristics.

FIG. 5 shows a plot of forward and reverse I-V characteristics HEMTs prior to off-state drain-voltage step-stressing, after off-state drain-voltage step-stressing, and following subsequent thermal annealing at 450° C. for 10 minutes in nitrogen ambient. There were slight degradations of Schottky barrier height and ideality factor after step-stressing, as shown in FIG. 1 and summarized in Table 1. Table 1 shows Schottky barrier and ideality factor of the HEMTs before off-state drain-voltage step-stress ("reference"), after the off-state drain-voltage step-stress, and following a subsequent thermal annealing at 450° C. for 10 minutes (subsequent to the off-state drain-voltage step-stress). There was some recovery for the Schottky barrier and ideality factor after thermal annealing, though not necessarily a full recovery. The reverse bias gate leakage current increased significantly by around 28 times at Vg=−10V as compared to the reference HEMTs (no step-stressing), resulting from step-stress induced gate metal diffusions and notches formed on the AlGaN/GaN layer along the gate edges on both source and drain sides. These defects may be the cause of permanent device degradation, such as an increase of reverse bias gate leakage current and lowered drain current on/off ratio as well as saturation drain current. Unexpectedly and advantageously, the reverse bias gate leakage current fully recovered after annealing step-stressed devices at 450° C. for 10 minutes in nitrogen ambient. The thermal annealing process neither reversed the gate metal diffusion nor alleviated notch formation on the AlGaN/GaN layer along the gate edges. Because the thermal annealing recuperated the reverse bias gate leakage current, the observed degradation of HEMT DC performance after off-state drain-voltage step-stressing is not related to gate metal diffusion or notch formation on the AlGaN/GaN layer in the devices tested.

TABLE 1

Schottky barrier and ideality factor.

| Sample | Schottky Barrier Height (V) | Ideality factor |
|---|---|---|
| Reference | 0.76 | 1.52 |
| After step-stress | 0.72 | 1.56 |
| After annealing | 0.73 | 1 53 |

Figure 6:
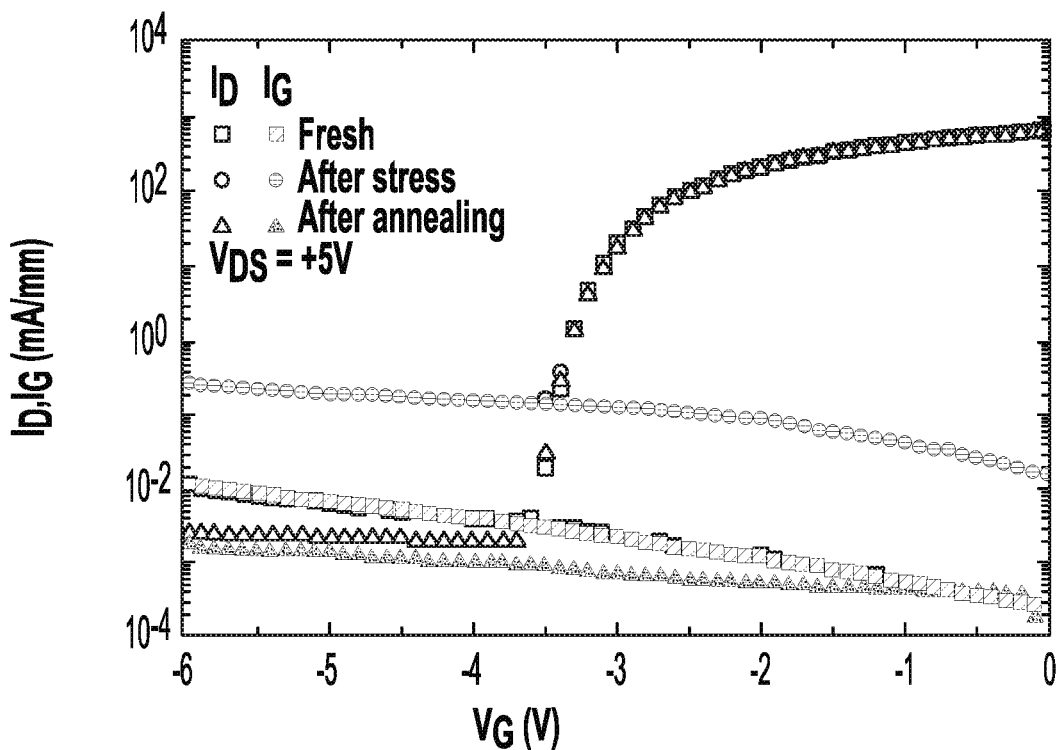
FIG. 6 shows a plot of drain current and gate leakage current as a function of gate voltage.

Similar trends were observed for the transfer characteristics, as shown in FIG. 6. FIG. 6 shows a plot of drain current and gate leakage current as a function of gate voltage. The currents are shown for AlGaN/GaN HEMTs prior to off-state drain-voltage step-stressing, after off-state drain-voltage step-stressing, and following subsequent thermal annealing at 450° C. for 10 minutes in nitrogen ambient.

Referring to FIG. 6, the drain current is plotted as a function of gate voltage at a fixed drain voltage of +5V for the HEMTs prior to off-state drain-voltage step-stressing, after step-stressing, and following subsequent thermal annealing at 450° C. for 10 minutes in nitrogen ambient. After off-state drain voltage step-stressing, HEMT DC performance considerably degraded. In addition, significant increases of sub-threshold swing and sub-threshold leakage current occurred, as did reduction of saturation drain current and drain current on-off ratio, as illustrated in Table 2. Table 2 shows sub-threshold drain leakage current, the slope swing of the sub-threshold drain current, and drain current on/off ratio of the HEMTs before off-state drain voltage step-stress ("reference"), after the off-state drain voltage step-stress, and following a subsequent thermal annealing at 450° C. for 10 minutes (subsequent to the off-state drain-voltage step-stress). The drain leakage current was dominated by reverse-biased gate current when the device was pinched off. Thus, both sub-threshold swing and sub-threshold drain leakage current corresponded to changes in reverse gate leakage current.

TABLE 2

Sub-threshold drain leakage current, the slope swing of the sub-threshold drain current, and drain current on/off ratio.

| Sample | Sub-threshold drain leakage current (µA) | Sub-threshold swing (mV/dec) | ON/OFF ratio |
|---|---|---|---|
| Reference | 0.42 | 108 | $1.9 \times 10^5$ |
| After step-stress | 21 | 163 | $4.52 \times 10^3$ |
| After annealing | 0.134 | 107 | $3.33 \times 10^5$ |

Drain current sub-threshold swing can be used to quantify trap densities in the gate modulated region of metal oxide semiconductor field effect transistors and AlGaN/GaN HEMTs, and drain current on-off ratio can indicate the quality of charge modulation in the two dimensional electron gas channel, as well as the power added efficiency, linearity, noise figure, and reliability of power amplifiers. Both sub-threshold characteristics and drain current on-off ratio are highly dependent on the reverse biased gate leakage current. Because gate leakage current considerably increased after off-state step-stress, the sub-threshold characteristics and drain current on-off ratio degraded. After 450° C. annealing, all these degraded characteristics recovered. The sub-threshold swing decreased from 163 to 107 mV/dec and drain current on-off ratio increased from $4.52 \times 10^3$ to $3.33 \times 10^5$. These improvements were a result of gate leakage reduction and saturation drain current augmentation. These results also showed that the damage from the off-state step-stressing was not permanent and could be removed by thermal annealing.

Figure 7A:
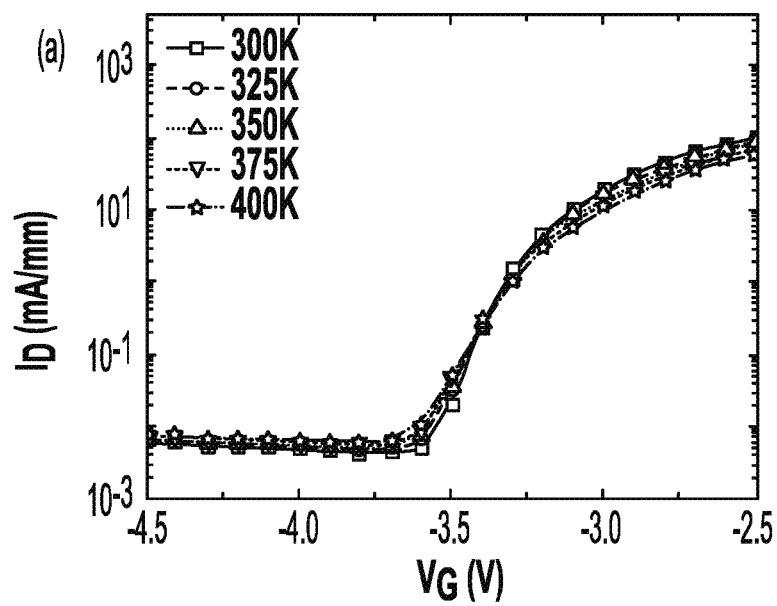
FIG. 7a shows a plot of drain current as a function of gate voltage at different temperatures.
Figure 7B:
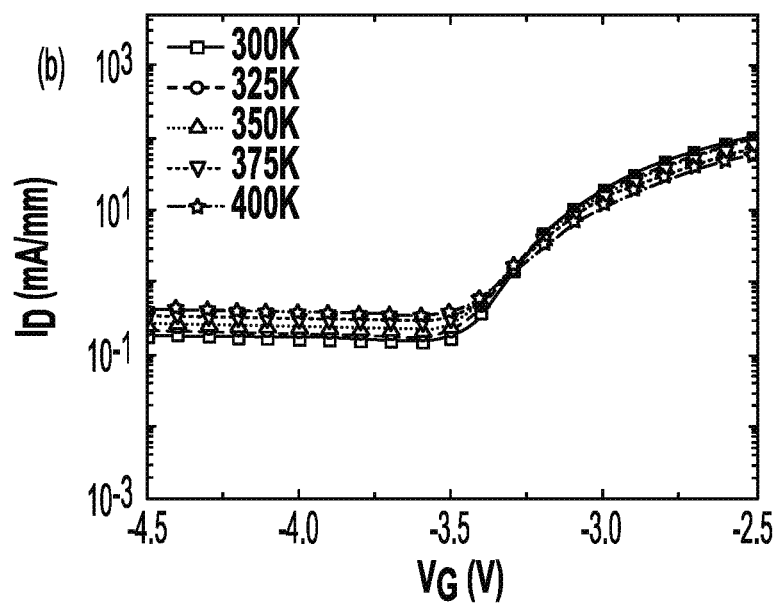
FIG. 7b shows a plot of drain current as a function of gate voltage at different temperatures.
Figure 7C:
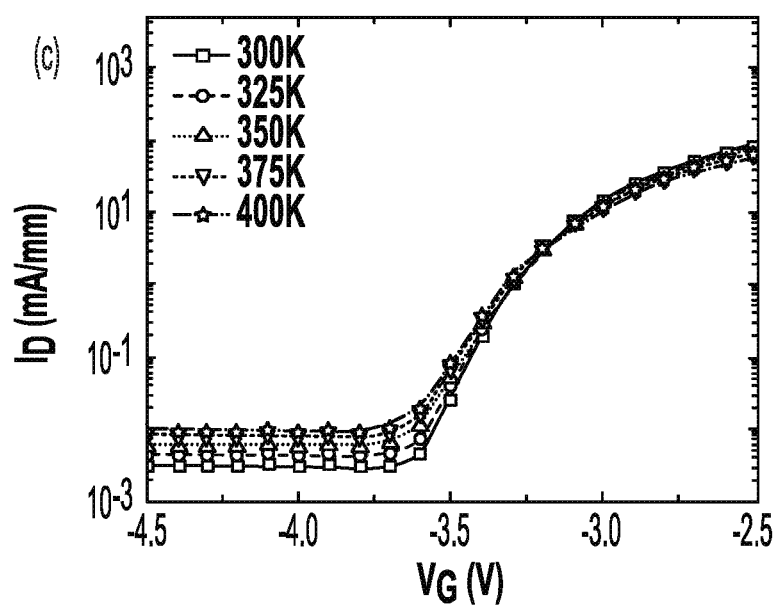
FIG. 7c shows a plot of drain current as a function of gate voltage at different temperatures.
Figure 8:
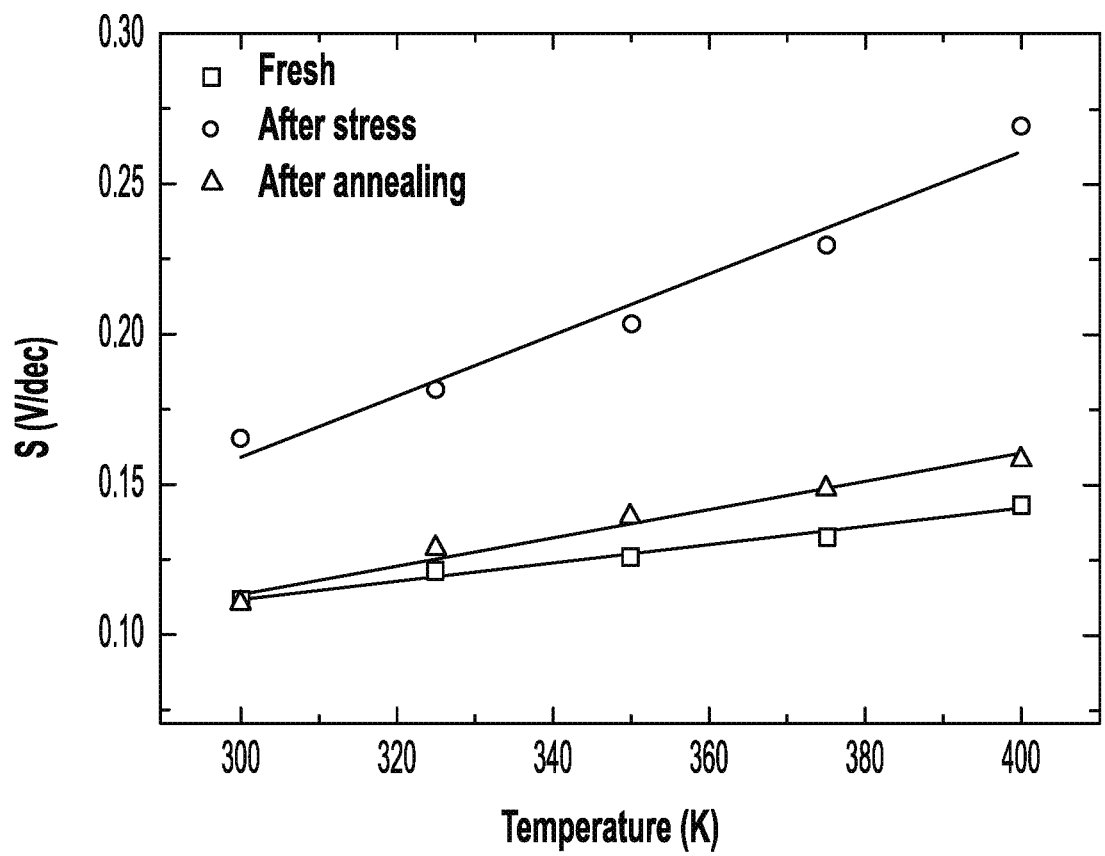
FIG. 8 shows a plot of sub-threshold swing as a function of temperature.

FIGS. 7a-7c show plots of sub-threshold drain current of HEMTs as a function of gate voltage at different temperatures. FIG. 7a shows a plot for HEMTs prior to off-state drain-voltage step-stressing, FIG. 7b shows a plot for HEMTs after off-state drain-voltage step-stressing, and FIG. 7c shows a plot for HEMTs following subsequent thermal annealing at 450° C. for 10 minutes in nitrogen ambient. FIG. 8 shows a plot of sub-threshold swing as a function of temperature for HEMTs prior to off-state drain-voltage step-stressing, after off-state drain-voltage step-stressing, and following subsequent thermal annealing at 450° C. for 10 minutes in nitrogen ambient.

Referring to FIGS. 7a-7c and 8, both sub-threshold slope and sub-threshold leakage current were correlated to reverse gate leakage current because the drain leakage current was dominated by the reverse-biased gate current in the pinched-off region. This temperature-dependent behavior of gate leakage current in AlGaN/GaN heterostructures was attributed to surface hopping as the emission of electrons from a trapped state near the metal-semiconductor interface into a continuum of states associated with each conductive dislocation based on the Frenkel-Poole model (see also Mitrofanov et al., supra.). The subthreshold swing of off-state step-stressed HEMTs was more sensitive to the ambient temperature resulting from the higher density of traps generated during step-stressing. These traps appeared to be able to be annealed out at 450° C. By analogy with MOSFETs, the equation for trap density of AlGaN/GaN HEMT is given by Equations (1)-(3) above.

ζ can be evaluated from Equation (3) using the slope of the S vs. T curve. The estimated interface trap density from $C_{it}$ with Equations (1) and (2) were $2.15 \times 10^{12}$, $1.63 \times 10^{13}$, and $5.21 \times 10^{12}$/cm²-V for HEMTs prior to off-state drain-voltage step-stressing, after off-state drain-voltage step-stressing, and after subsequent thermal annealing, respectively, as illustrated in FIG. 8. The thermal annealing at 450°

C. for 10 minutes in nitrogen ambient followed the step-stressing. The increase in trap densities after off-state drain voltage step-stress was caused by additionally generated traps during the off-state step-stressing, which provides more gate leakage paths. Because these traps could be removed by thermal annealing, these traps should not be induced by gate metal diffusion, dislocations, interface oxide intermixing with the semiconductor, and/or notch formation around the gate edges.

EXAMPLE 3

HEMT device structures were grown on semi-insulating 6H—SiC substrates, and consisted of a thin AlN nucleation layer, 2.25 µm of Fe-doped GaN buffer, 15 nm of $Al_{0.28}Ga_{0.72}N$, and a 3 nm undoped GaN cap. On-wafer Hall measurements showed a sheet carrier concentration and mobility of $1.06 \times 10^{13}$ cm$^{-2}$ and 1907 cm$^2$/V-s, respectively. Device isolation of Double-finger HEMTs was achieved with dry-etch based mesa definition. Ti/Al/Ni/Au Ohmic contacts were alloyed at 850° C., producing a contact resistance of 0.3 Ω-mm. Dual-finger Ni/Au gates were defined by standard lift-off and the gate dimension was 2×1 µm×150 µm. Schottky barrier height of Ni/Au gates was around 0.8 V. The HEMTs were passivated with 120 nm $SiN_x$ deposited by plasma enhanced chemical vapor deposition.

Off-state drain-voltage step-stress was employed to degrade the dc performance of the HEMTs. The stress started at 5 V of drain voltage, with the source electrode grounded and the gate voltage fixed at −8 V. The increment of the drain voltage step was 1 V, and each drain voltage step was pulsed constantly for 1 minute until a critical voltage was reached. The critical voltage was defined as the onset of a sudden total gate leakage current increase during the stress. Thermal annealing effect was conducted for the post-stress HEMTs at 450° C. for 10 mins in nitrogen ambient using a SSI Solaris 150 rapid thermal annealing (RTA) system.

Figure 9A:
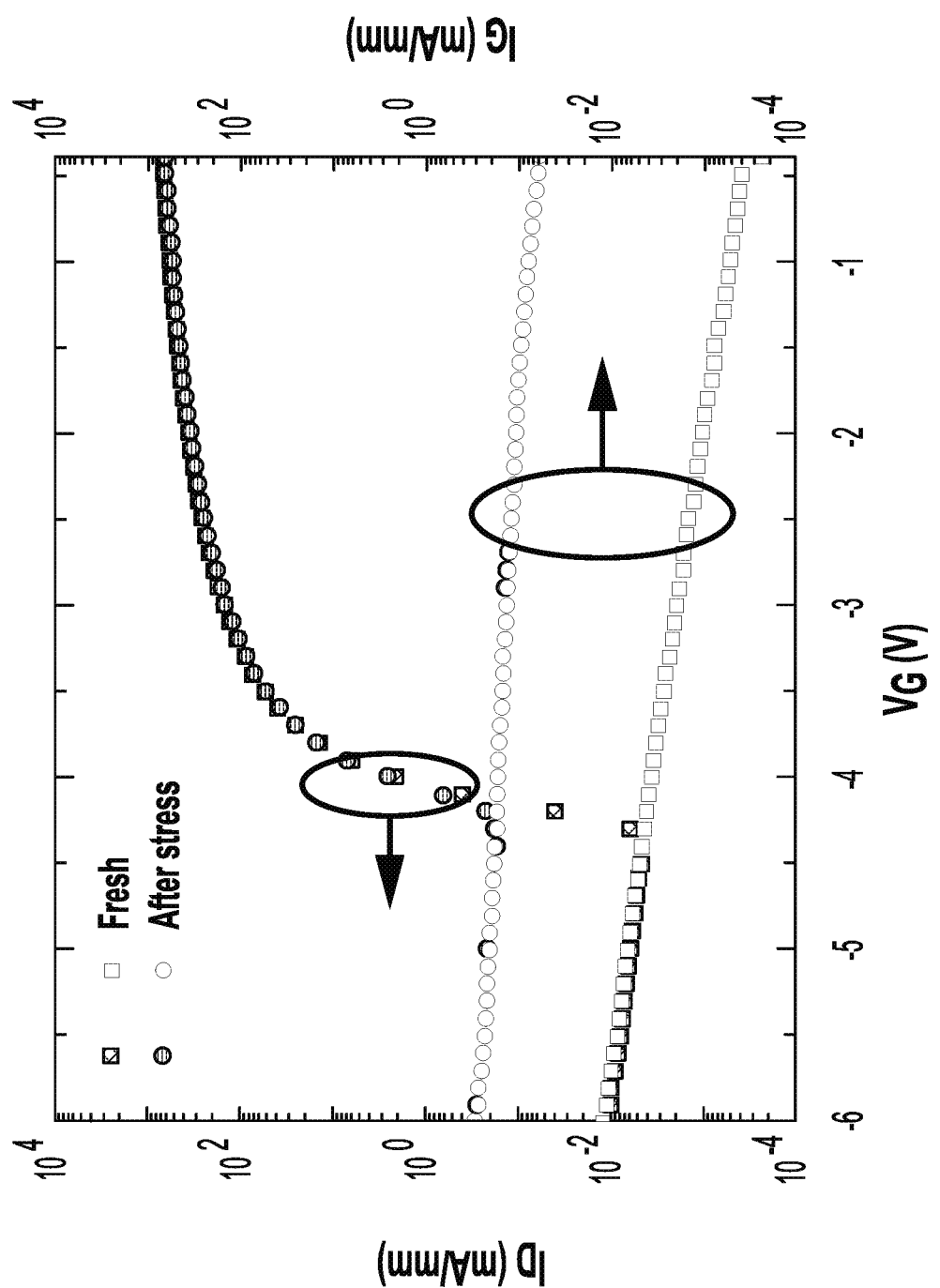
FIG. 9A shows gate voltage dependent drain current and gate leakage current, as a function of gate voltage, of AlGaN/GaN HEMTs prior to and after off-state step-stressing.
Figures 9B, 9C:
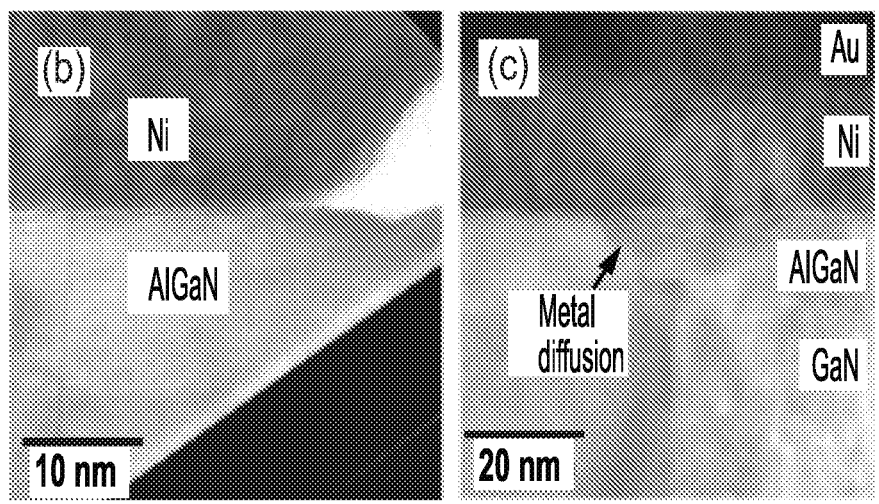
FIG. 9B shows a cross-sectional TEM image of the gate finger and underlying nitride layer close to the source contact.
FIG. 9C shows a cross-sectional TEM image of the interface between an Ni/Au Schottky gate contact and the underlying nitride layer of the stressed HEMT after reaching the critical voltage.

The critical voltages of HEMTs employed in this study were around 30-50 V. After HEMT reaching the critical voltage during the off-state step-stressing, dc performance of the stressed HEMT considerably degraded; increases of sub-threshold swing and sub-threshold leakage current, as well as reductions of saturation drain current and drain current on-off ratio were observed as shown in FIG. 9A. Due to the low drain-to-source current during off-state stressing, self-heating effects were negligible and had no effect on the device degradation. A notch usually appeared on drain side or on both drain and source sides of the gate finger for the degraded HEMT after step-stressing due to the inverse piezoelectric effect, as illustrated in FIG. 9B. There are regions exhibiting interactions between Ni of the Au/Ni based Schottky gate with the underlying nitride layer close to a position of threading dislocation (TD), as shown in FIG. 9C. The interaction of Ni and underlying nitride layer was also observed on the thermally annealed HEMTs. The notch formation around the edges of gate fingers and the interaction between Ni and nitride layer resulted in increasing sub-threshold swing and sub-threshold leakage current, as well as decreasing saturation drain current and drain current on-off ratio.

Figure 10:
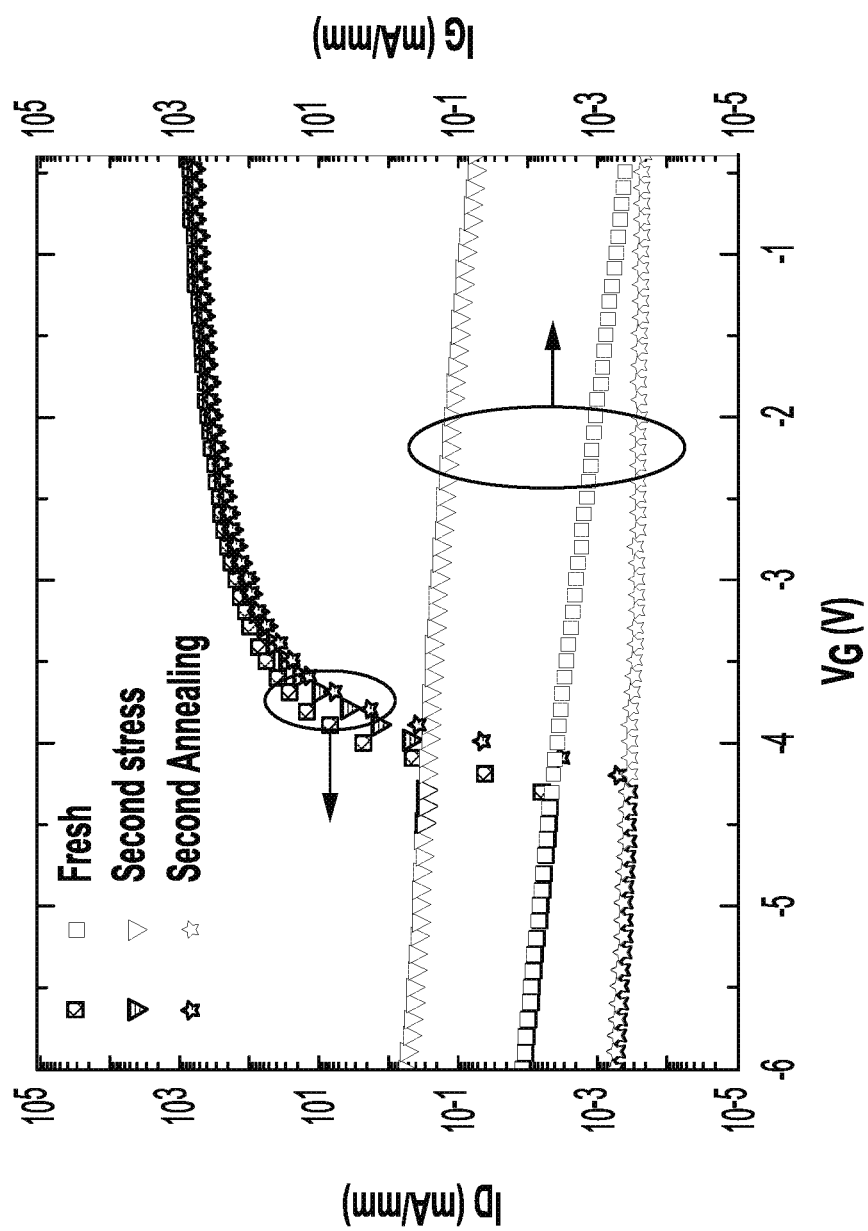
FIG. 10 shows the gate voltage dependent drain current and gate leakage current of AlGaN/GaN HEMTs after second step-stress followed by second thermal annealing.

As shown in FIGS. 9A and 10, degradation of HMET's DC performance resulted from off-state step-stressing after reaching the critical voltage was completely recovered by thermal annealing at 450° C. for ten minutes. Similar DC degradation was observed for those annealing-recovered HEMTs after second off-state drain-voltage step-stressing, and the dc performance of the degraded HEMTs was fully recovered again after a second 450° C. thermal annealing. This indicated that defects created during the off-state step-stressing could be recovered by a thermal annealing. Apparently, the thermal annealing process could not remove this metal diffusion nor the notch formation along the gate edges. Thus, gate metal diffusion nor notch formation on the AlGaN/GaN layer after off-state step stress or thermal annealing were not related to the degradations of the dc performance. These degradations could result from creating shallow traps during off-state step-stressing, and these traps were able to be annealed out with the thermal annealing process.

Drain current sub-threshold swing was employed to investigate the number of trap densities created in HMETs after off-state step-stressing. Drain current sub-threshold swing has been commonly used to estimate trap densities in metal oxide semiconductor field effect transistors and AlGaN/GaN HEMTs. The sub-threshold swing increased from ~98 to ~187 mV/dec after step-stressing and recovered back to ~95 mV/dec after thermal annealing. Temperature dependent sub-threshold swings were measured to determine the corresponding interface trap density of HEMTs at different stages of this study. The trap density of the reference HEMT was around $2.15 \times 10^{12}$/cm$^2$-V. After the first and the second step-stressing, the trap den density increased to $6.31 \times 10^{12}$ and $6.19 \times 10^{12}$/cm$^2$-V, respectively. The trap density recovered to $3.56 \times 10^{12}$ and $4.81 \times 10^{12}$/cm$^2$-V after the first and second thermal annealing, respectively. It is possible that the neutral traps are charged during the device operation from the hot electrons. These negative charges on the HEMT surface and in AlGaN as well as GaN channel layer would alter the conduct band bending, reduce the carrier concentration in the two dimensional gas channel and increase the gate leakage current. The thermal annealing could provide energy for charged traps to go through a de-trapping process and become neutral traps.

Figure 11:
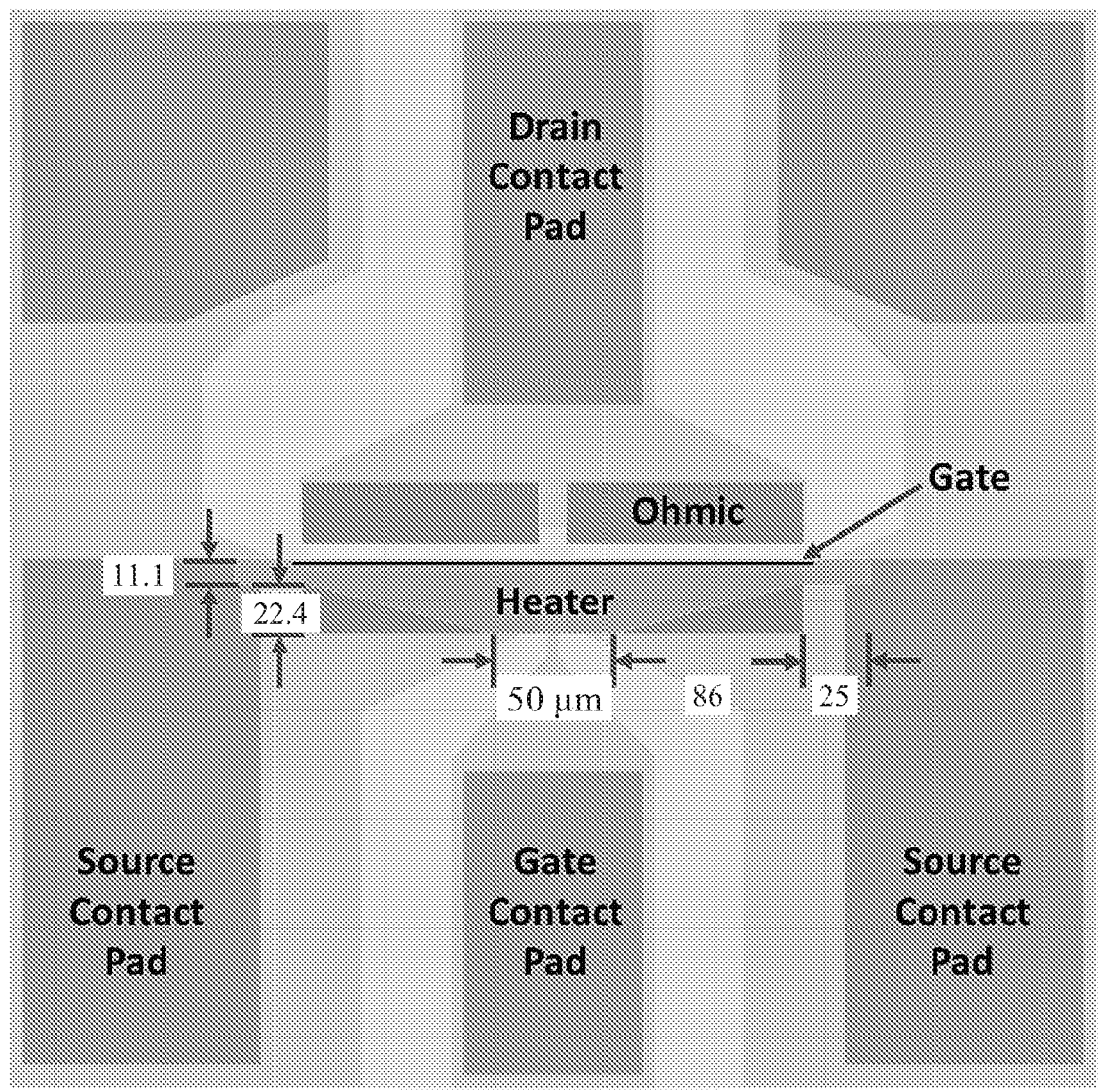
FIG. 11 shows a schematic of an exemplary HEMT integrated with an on-chip trapezoid-shaped heater.

Although the thermal annealing in the RTA system could recover the device degradation, this process would be able to be applied to the HEMTs in the packaged integrated circuit or system. A shown in FIG. 11, an on-chip heater was designed to accomplish the same annealing process for the discrete HEMTs. Pt-based heater was employed as the heating element. A trapezoid configuration was employed for the heater to achieve uniform temperature distributions across the active region by reducing the resistance in the middle section of the heater. The Pt-based heater extended over the gap between source and gate, and extended 1.5 µm over the gate edge toward the drain.

Figure 12:
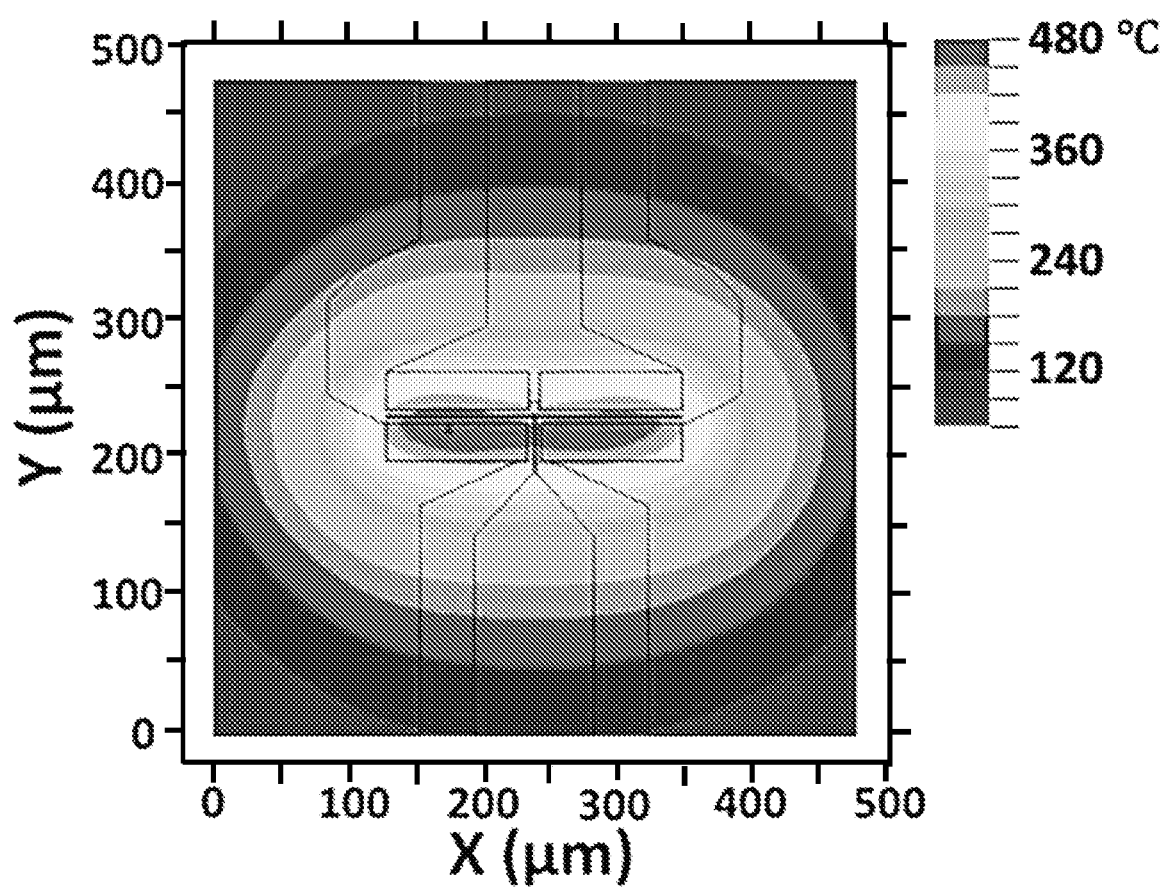
FIG. 12 shows the thermal simulated junction temperature of an HEMT with an exemplary integrated trapezoid-shaped Pt heater.

The junction temperature of the HEMT integrated with an on-chip can be increased by applying a bias voltage across the source contact pads. By applying 19 V across a 300-nm Pt heater, a maximum temperature of 467° C. was reached under the gate region, as shown in FIG. 12. A similar design can be used for a multiple-finger power transistor. These results suggest that device degradations of drain current reduction and increases of parasitic resistance and gate leakage current were completely recuperated after annealing at 450° C. for 10 minutes.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

The examples and embodiments described herein are for illustrative purposes only and various modifications or changes in light thereof will be suggested to persons skilled in the art and are included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

All patents, patent applications, provisional applications, and publications referred to or cited herein (including those in the "References" section) are incorporated by reference in their entirety, including all figures and tables, to the extent they are not inconsistent with the explicit teachings of this specification.

REFERENCES

1. R. Wang, P. Saunier, Y. Tang, T. Fang, X. Gao, S. Guo, G. Snider, P. Fay, D. Jena and H. Xing, IEEE Electron Device Lett. 32, 309 (2011).
2. M. Z. Peng, Y. K. Zheng, K. Wei and X. Y. Liu, Microelectron. Eng. 87, 2638 (2010).
3. J. Lee, D. Liu, H. Kim and W. Lu, Solid-State Electron. 48, 1855 (2004).
4. L. Liu, Y. Xi, S. Ahn, F. Ren, B. P. Gila, S. J. Pearton and I. I. Kravchenko, J. Vac. Sci. Technol. B 32, 052201 (2014).
5. H. Kim, J. Lee, D. Liu and W. Lu, Appl. Phys. Lett. 86, 143505 (2005).
6. M. Johnson, D. Cullen, L. Liu, T. S. Kang, F. Ren, C. Y. Chang, S. J. Pearton, S. Jang, J. W. Johnson and D. J. Smith, J. Vac. Sci. Technol. B30, 062204 (2012).
7. D. Cheney, E. Douglas, L. Liu, C. F. Lo, Y. Xi, B. P. Gila, F. Ren, D. Horton, M. E. Law, D. Smith and S. J. Pearton, Semicond. Sci. Technol. 28, 074019 (2013)
8. G. Meneghesso, G. Verzellesi, F. Danesin, F. Rampazzo, F. Zanon and A. Tazzoli, IEEE Trans. Dev. Mater. Reliab. 8, 332 (2008).
9. P. Makaram, J. Joh, J. A. del Alamo, T. Palacios and C. V. Thompson, Appl. Phys. Lett. 96, 233509 (2010).
10. E. Zanoni, G. Meneghesso, G. Verzellesi, F. Danesin, M. Meneghini, F. Rampazzo, A. Tazzoli, and F. Zanon, IEDM 381 (2007).
11. J. W. Chung, J. C. Roberts, E. L. Piner and T. Palacios, IEEE Electron Device Lett. 29, 1196 (2008).
12. J. W. Chung, X. Zhao and T. Palacios, in Proc. 65$^{th}$ Device Res. Conf., 111 (2007).
13. W. S. Tan, P. A. Houston, P. J. Parbrook, D. A. Wood, G. Hill and C. R. Whitehouse, Appl. Phys. Lett. 80, 3207 (2002).
15. O. Mitrofanov and M. Manfra, J. Appl. Phys. 95, 6414 (2004).
16. H. F. Sun, A. R. Alt, H. Benedickter and C. R. Bolognesi, IEEE Electronics Lett. 45, 376 (2009).
17. M. Singh and J. Singh, J. Appl. Phys. 94, 2498 (2003).
18. M. A. Khan, X. Hu, A. Tarakji, G. Simin, J. Yang, R. Gaska and M. Shur, Appl. Phys. Lett. 77, 1339 (2000).
19. J. W. Johnson, A. G. Baca, R. D. Briggs, R. J. Shul, C. Monier, F. Ren, S. J. Pearton, A. M. Dabiran, A. M. Wowchack, C. J. Polley and P. P. Chow, Solid State Electron. 45, 1979 (2001).
20. H. Hasegawa and M. Akazawa, J. Vac. Sci. Technol. B 27, 2048 (2009).
21. S. Karmalkar, N. Satyan and D. M. Sathaiya, IEEE Electron Device Lett. 27, 87 (2006).
21. N.-Q. Zhang, B. Moran, S. P. DenBaars, U. K. Mishra, X. W. Wang and T. P. Ma, IEEE Int. Electron Devices Meet., Tech Dig. 2001, 589.
23. M. Gassoumi, O. Fathallah, C. Gaquiere and H. Maaref, Physica B 405, 2337 (2010).
24. M. Gassoumi, M. M. Ben Salem, S. Saadaoui, B. Grimbert, J. Fontaine, C. Gaquiere and H. Maaref, Microelectron. Eng. 88, 370 (2011).
25. A. P. Zhang, L. B. Rowland, E. B. Kaminsky, V. Tilak, J. C. Grande, J. Teetsov, A. Vertiatchikh and L. F. Eastman, J. Electron. Mater. 32, 388 (2003).
26. H. Kim, A. Vertiatchikh, R. M. Thompson, V. Tilak, T. R. Prunty, J. R. Shealy and L. F. Eastman, Microelectron. Reliab. 43, 823 (2003).
27. O. Mitrofanov, M. Manfra and N. Weimann, Appl. Phys. Lett. 82, 4361 (2003).
28. B. M. Green, K. K. Chu, E. M. Chumbes, J. A. Smart, J. R. Shealy and L. F. Eastman, IEEE Trans. Electron Devices 21, 268 (2000).
29. Y. Ohno, T. Nakao, S. Kishimoto, K. Maezawa and T. Mizutani, Appl. Phys. Lett. 84, 2184 (2004).
30. H.-Y. Liu, B.-Y. Chou, W.-C. Hsu, C.-S. Lee and C.-S. Ho, IEEE Trans. Electron Devices 58, 4430 (2011).
31. T. Hashizume, S. Ootomo, T. Inagaki and H. Hasegawa, J. Vac. Sci. Technol. B 21, 1828 (2003).
32. A. Hierro, S. A. Ringel, M. Hansen, J. S. Speck, U. K. Mishra and S. P. DenBaars, Appl. Phys. Lett. 77, 1499 (2000).
33. L. Liu, T. S. Kang, D. A. Cullen, L. Zhou, J. Kim, C. Y. Chang, E. A. Douglas, S. Jang, D. J. Smith, S. J. Pearton, W. J. Johnson and F. Ren, J. Vac. Sci. Technol. B 29, 032204 (2011).
34. C. Y. Chang, T. Anderson, J. Hite, L. Liu, C. F. Lo, B. H. Chu, D. J. Cheney, E. A. Douglas, B. P. Gila, F. Ren, G. D. Via, P. Whiting, R. Holzworth, K. S. Jones, S. Jang and S. J. Pearton, J. Vac. Sci. Technol. B 28, 1044 (2010).
35. U.S. Pat. No. 8,138,573 B2, March 2012, Cannon et al.
36. U.S. Pat. No. 7,723,824 B2, May 2010, Guarin et al.
37. R. S. Pengelly et al. IEEE T. Microw. Theory 60, 1764 (2012).
38. F. H. Raab, in: *Microwave Symposium Digest*, Electronically Tuned UHF Amplifier (IEEE, Baltimore, Md., 2011), pp. 1-4.
39. M. Wang et al. IEEE Electr. Device L. 32, 482 (2011).
40. M. Faqir et al. Microelectron. Reliab. 47, 1639 (2007).
41. Z. Q. Fang et al. J. Appl. Phys. 108, 063706 (2010).
42. B. J. Kim, J. Appl. Phys. Lett. 106, 153504 (2015).
43. L. Liu et al. J. Vac. Sci. Technol. B 29, 060603 (2011).

What is claimed is:
1. A semiconductor device comprising:
at least one high electron mobility transistor (HEMT) provided on a substrate, wherein the at least one HEMT comprises an active area, and an Ohmic structure over the active area; and
a built-in heating source provided on the substrate, wherein the heating source is integrated with the Ohmic structure over the active area to change a temperature of the HEMT, wherein a first width of the heating source over the active area of the HEMT is larger than a second width of the heating source not over the active area.

2. The device according to claim 1, wherein a Schottky barrier and a cap layer of the HEMT comprise distinct semiconductor compounds with dissimilar bandgaps.

3. The device according to claim 2, wherein a barrier material of the Schottky barrier is AlxGai-xN, and wherein the cap layer material is GaN.

4. The device according to claim 1, wherein the HEMT is an enhancement-mode GaN-based HEMT,
wherein the HEMT comprises distinct semiconductor compounds with dissimilar bandgaps, and
wherein the HEMT does not comprise silicon as a barrier layer material.

5. The device according to claim 1, wherein the HEMT is a depletion-mode GaN-based HEMT,
wherein the HEMT comprises distinct semiconductor compounds with dissimilar bandgaps, and
wherein the HEMT does not comprise silicon as a barrier layer material.

6. The device according to claim 1, wherein the HEMT includes a wider energy bandgap nitride-based layer, and
wherein the wider energy bandgap nitride-based layer comprises AlGaN, AlN, or InAlN.

7. The semiconductor device according to claim 1, wherein the heating source is Pt-based.

8. A semiconductor device capable of thermally recovering the DC and RF performance thereof, the semiconductor device comprising:
at least one HEMT provided on a substrate, under normal conditions for a period of time, shows degradation in the form of at least one of gate leakage current increase and drain current reduction, wherein the at least one HEMT comprises an active area and an Ohmic structure over the active area; and a built-in heating source provided on the substrate, wherein the heating source is integrated with the Ohmic structure over the active area to thermally anneal the at least one degraded HEMT, wherein a first width of the heating source over the active area of the HEMT is larger than a second width of the heating source not over the active area.

9. The device according to claim 8, wherein prior to annealing, the at least one HEMT degrades due to trap creation in the at least one HEMT during device operation over the period of time.

10. The device according to claim 8, wherein the annealing is performed at a temperature of from 400° C.-900° C.

11. The device according to claim 10, wherein the annealing is performed at a temperature of about 450° C. for about 10 minutes or at a temperature of about 850° C. for about 10-45 seconds.

12. The device according to claim 8, wherein the thermal anneal occurs in an inert environment.

13. The device according to claim 8, wherein the built-in heating source comprises platinum, has a trapezoid configuration, or both comprises platinum and has a trapezoid configuration.

14. The device according to claim 8, wherein the heating source is Pt-based.

* * * * *

UNITED STATES PATENT AND TRADEMARK OFFICE
CERTIFICATE OF CORRECTION

PATENT NO. : 10,504,811 B2
APPLICATION NO. : 15/551490
DATED : December 10, 2019
INVENTOR(S) : Fan Ren et al.

Page 1 of 1

It is certified that error appears in the above-identified patent and that said Letters Patent is hereby corrected as shown below:

In the Claims

In Claim 6, at Column 15, Line 25, delete the text "A1N, or InAlN" and replace it with the text --AlN, or InAlN--.

Signed and Sealed this
Eighteenth Day of February, 2020

Andrei Iancu
*Director of the United States Patent and Trademark Office*